United States Patent [19]

Lewis

[11] Patent Number: 4,947,480

[45] Date of Patent: Aug. 7, 1990

[54] MULTICHANNEL SIGNAL ENHANCEMENT

[75] Inventor: Paul S. Lewis, Los Alamos, N. Mex.

[73] Assignee: The United States of America as represented by the United States Department of Energy, Washington, D.C.

[21] Appl. No.: 264,722

[22] Filed: Oct. 31, 1988

[51] Int. Cl.$^5$ .............................................. G06F 7/38
[52] U.S. Cl. .............................. 364/572; 364/413.05; 364/724.01
[58] Field of Search ................... 364/413.05, 572, 574, 364/724.01

[56] References Cited

PUBLICATIONS

Robert A. Monzingo et al., "Recursive Methods for Adaptive Array Processing," *Introduction to Adaptive Arrays*, John Wiley & Sons (1980), pp. 319-327.
W. M. Gentleman, "Matrix Triangularization by Systolic Arrays," 298 SPIE Real-Time Signal Processing IV, pp. 19-26 (1981).
J. G. McWhirter, "Recursive Least-Squares Minimization Using a Systolic Array," 431 Proc. SPIE-Real Time Signal Processing VI, K. Bromley, Ed., pp. 105-112 (1983).
S. Haykin, Adaptive Filter Theory, Prentice-Hall, Englewood Cliffs, N.J. (1986, pp. 494-541, describes the arrays of Gentleman and McWhirter (publications 2 and 3, above) and further describes a recursive RLS-QR architecture that uses back substitution at FIG. 10.2, pp. 512-515.

*Primary Examiner*—Clark A. Jablon
*Attorney, Agent, or Firm*—Ray G. Wilson; Paul D. Gaetjens; William R. Moser

[57] ABSTRACT

A mixed adaptive filter is formulated for the signal processing problem where desired a priori signal information is not available. The formulation generates a least squares problem which enables the filter output to be calculated directly from an input data matrix. In one embodiment, a folded processor array enables bidirectional data flow to solve the recursive problem by back substitution without global communications. In another embodiment, a balanced processor array solves the recursive problem by forward elimination through the array. In a particular application to magnetoencephalography, the mixed adaptive filter enables an evoked response to an auditory stimulus to be identified from only a single trial.

9 Claims, 12 Drawing Sheets

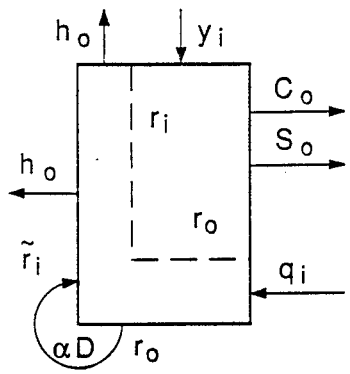

$$r_o \leftarrow \sqrt{\lambda^2 r_i + y_i^2}$$
$$C_o \leftarrow \lambda r_i / r_o \quad \begin{pmatrix} QR \\ PART \end{pmatrix}$$
$$S_o \leftarrow y_i / r_o$$
$$h_o \leftarrow q_i / \tilde{r}_i \quad \begin{pmatrix} BS \\ PART \end{pmatrix}$$

$\tilde{r}_i$ IS VALUE OF
PREVIOUS $r_o$ COMPUTED $\alpha = 2(2m + 1 - j - k)$ CYCLES BEFORE.
WHERE $m = $ # INPUT CHANNELS
$j = $ ROW OF NODE
$k = $ COLUMN OF NODE

*Fig. 2B*

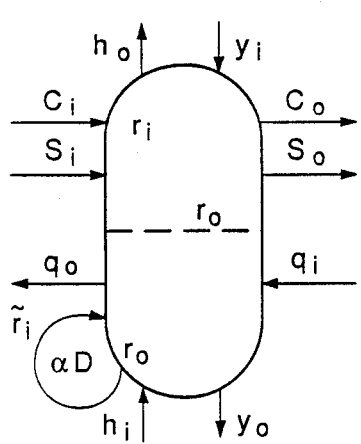

$$C_o \leftarrow C_i$$
$$S_o \leftarrow S_i \quad \begin{pmatrix} QR \\ PART \end{pmatrix}$$
$$r_o \leftarrow C_i \lambda r_i + S_i y_i$$
$$y_o \leftarrow S_i \lambda r_i + C_i y_i$$
$$h_o \leftarrow h_i$$
$$q_o \leftarrow q_i - h_i \tilde{r}_i \quad \begin{pmatrix} BS \\ PART \end{pmatrix}$$

$\tilde{r}_i$ IS VALUE OF
PREVIOUS $r_o$ COMPUTED $\alpha = 2(2m + 1 - j - k)$ CYCLES BEFORE.
WHERE $m = $ # INPUT CHANNELS
$j = $ ROW OF NODE
$k = $ COLUMN OF NODE

*Fig. 2C*

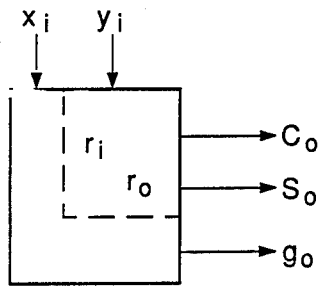

$$r_o \leftarrow \sqrt{\lambda^2 r_i^2 + y_i^2}$$
$$C_o \leftarrow \lambda r_i / r_o \quad \begin{pmatrix} QR \\ PART \end{pmatrix}$$
$$S_o \leftarrow y_i / r_o$$

$$g_o \leftarrow x_i / r_o \quad \begin{pmatrix} FE \\ PART \end{pmatrix}$$

Fig. 4B

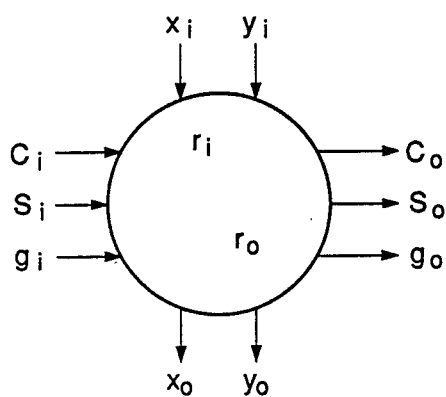

$$C_o \leftarrow C_i$$
$$S_o \leftarrow S_i \quad \begin{pmatrix} QR \\ PART \end{pmatrix}$$
$$r_o \leftarrow C_i \lambda r_i + S_i y_i$$
$$y_o \leftarrow S_i \lambda r_i + C_i y_i$$

$$g_o \leftarrow g_i \quad \begin{pmatrix} FE \\ PART \end{pmatrix}$$
$$x_o \leftarrow x_i - g_i r_o$$

Fig. 4C

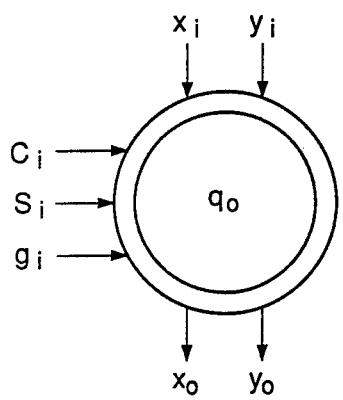

$$q_o \leftarrow S_i y_i \quad \begin{pmatrix} QR \\ PART \end{pmatrix}$$
$$y_o \leftarrow C_i y_i$$

$$x_o \leftarrow x_i + g_i q_o \quad \begin{pmatrix} VV \\ PART \end{pmatrix}$$

Fig. 4D

MULTICHANNEL SIGNAL ENHANCEMENT

This invention is the result of a contract with the Department of Energy (Contract No. W-7405-ENG-36).

BACKGROUND OF THE INVENTION

This invention relates generally to signal processing and, more particularly, to the area of multichannel least squares adaptive filtering.

In many multisensor signal processing applications, e.g., radar/sonar beamforming, magnetoencephalography, seismology data, and the like complete a priori knowledge of the signal environment is lacking and/or the environment is changing. To determine the signal content from the sensor data, least squares-based adapted filters generally provide the best tradeoff between convergence or tracking rate and overall estimation error.

However, like most adaptive filters, conventional least squares adaptive filters require an explicit a priori desired signal for operation. In many applications no desired signal is available. Rather, the a priori knowledge exists in the form of the signal-to-data cross correlation. An example of this is adaptive radar/sonar beam forming in which the cross-correlating corresponds to the known steering vector.

For this class of application, a multiple-input, multiple-output mixed adaptive filter is needed which optimally combines the a priori cross-correlation knowledge with ongoing data measurements. Conventional filters of this class are computationally intensive and their performance is critically dependent on the underlying algorithm. There is no mixed adaptive filter that is based on an algorithm that is (1) efficient and numerically stable and (2) is regularly structured so that the filter can be readily implemented in hardware.

Array hardware architectures are generally designed to reflect the structure of the algorithms to be implemented, where the algorithms are mapped onto the elements of the array and scheduled in the proper order. Adaptive least squares-like algorithms are well-suited to implementation by array hardware architectures because they are characterized by regularity and data independence i.e., the required computations are independent of the actual data to be operated on.

Architectures for handling recursive least squares problems with an explicit desired signal have been proposed and, more particularly. Array architectures based on a QR decomposition followed by a back substitution. W. M. Gentleman et al., "Matrix Triangularization by Systolic Array". SPIE Proc. Real Time Signal Processing IV, p 298 (1981) incorporated herein by reference, proposes an architecture for the non-recursive Givens rotation problem. S. Haykin, Adaptive Filter Theory, Prentice-Hall, Englewood Cliffs, N. J. (1986), describes a recursive RLS-QR architecture that uses back substitution. However, an imbalance arises between the QR update and the back substitution at each step. Global communications are also required between the QR array and the back substitution array. A single channel architecture to calculate an estimation error is described in J. G. McWhirter, "Recursive Least-Squares Minimization Using a Systolic Array", SPIE Proc. Real Time Signal Processing VI p 105 (1983). However, there is no known balanced array architecture which can implement the multichannel mixed adaptive filter for applications in which no explicit desired signal is available.

Magnetoencephalography (MEG), the study of naturally occurring magnetic fields for the brain, provides a particularly difficult signal processing environment. Neuromagnetic fields are quite weak, ranging from $10^{-12}$ to $10^{-14}$ tesla (T). compared with urban background noise, $10^{-6}$ to $10^{-7}$ T. The effect of external magnetic fields on the signal-to-noise ratio is reduced by using magnetically shielded rooms and using sensors wired as first and second order gradiometers, but external and neural noise cannot be eliminated.

To obtain signal information, i.e., evoked response data, signal ensemble averaging is generally used. Measurements from multiple trials using the same stimulus are combined by simply averaging together the measurements from each trial at identical latencies (time delays) from the stimulus. Signal averaging produces optimal results when each evoked response is identical and the noise is additive and uncorrelated from trial to trial. However, evoked responses vary, both in latency and in waveform, so that signal averaging produces a distorted "average" response. Further signal averaging does not permit examination of individual trials and their variation.

These and other signal processing problems of the prior art are addressed by the present invention and improved processing algorithms and array architectures for the mixed adaptive filter are provided with particular application to MEG signal processing.

It is an object of the present invention to provide a signal processing algorithm for the multichannel mixed adaptive filter which is efficient and numerically stable.

It is another object to provide balanced array architectures onto which the signal processing algorithm can be mapped in both multiple and single output cases.

It is one other object of the present invention to provide array architectures with multiple input channel processing capability for estimating both multiple and single channel signal data from sensor output data.

Yet another object of the present invention is to provide for MEG single-trial enhancement utilizing prestimulus data, ensemble average data, or signal autocorrelation data as a priori information.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention, as embodied and broadly described herein, the apparatus of this invention may comprise a mixed adaptive filter for generating enhanced signal data from sensor input data. A triangular array of first processors is configured to move the sensor data through the array for decomposition with a triangular matrix stored in the array by a series of rotations to form successive updated triangular matrices for storage in the array while generating a first intermediate output. The first processors simultaneously process elements of the updated triangular matrices with corresponding elements of the first intermediate output to form a second intermediate output. A second processor array then converts the second intermediate output to the desired enhanced signal data.

In a particular embodiment of the present invention, a mixed adaptive filter is provided for MEG signal processing where an enhanced output signal showing an evoked response is obtained from sensor input during only a single trial run. A triangular array of first processors is configured to move the sensor data through the array for decomposition with a triangular matrix stored in the array by a series of rotations to form successive updated triangular matrices for storage in the first processors while generating a first intermediate output. The first intermediate output is then processed through the first processors with corresponding elements of the stored triangular matrices to form a second intermediate output. A second processor array then converts the second intermediate data to the desired enhanced signal data.

In another characterization of the present invention, a process is provided for generating an enhanced MEG output signal showing an evoked response to a stimulus from sensor input data obtained in a single trial including a selected stimulus. Sensor data is first obtained, i.e., in the absence of the selected stimulus or from averaged existing responses, for use in generating an initial autocorrelation matrix. An initial triangular matrix is stored in a corresponding triangular array of data processors. A second set of sensor data is then obtained during the selected stimulus. The second set of sensor data is processed through the triangular array in a first direction by updating the initial triangular matrix to form successive updated triangular matrices by Givens rotations and to output first intermediate outputs. The first intermediate outputs are then processed by back substitution with corresponding elements of the successive triangular matrices in a second direction through the triangular array to form second intermediate outputs. The second intermediate outputs are then converted by the autocorrelation matrix to form the enhanced MEG output signal.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings:

FIGS. 2A, 2B, 2C, 2D, and 2E depict processors to implement the array of FIGS. 1A and 1B without the necessity of communicating the elements of $R_t$ between separate sections of the array.

FIGS. 4A, 4B, 4C, and 4D depict processors to implement the array of FIG. 3 without the necessity of communicating the elements of $R_t$ and $q_t$ between separate sections of the array.

DETAILED DESCRIPTION OF THE PREFERRED EMBODIMENT

Figure 1A:
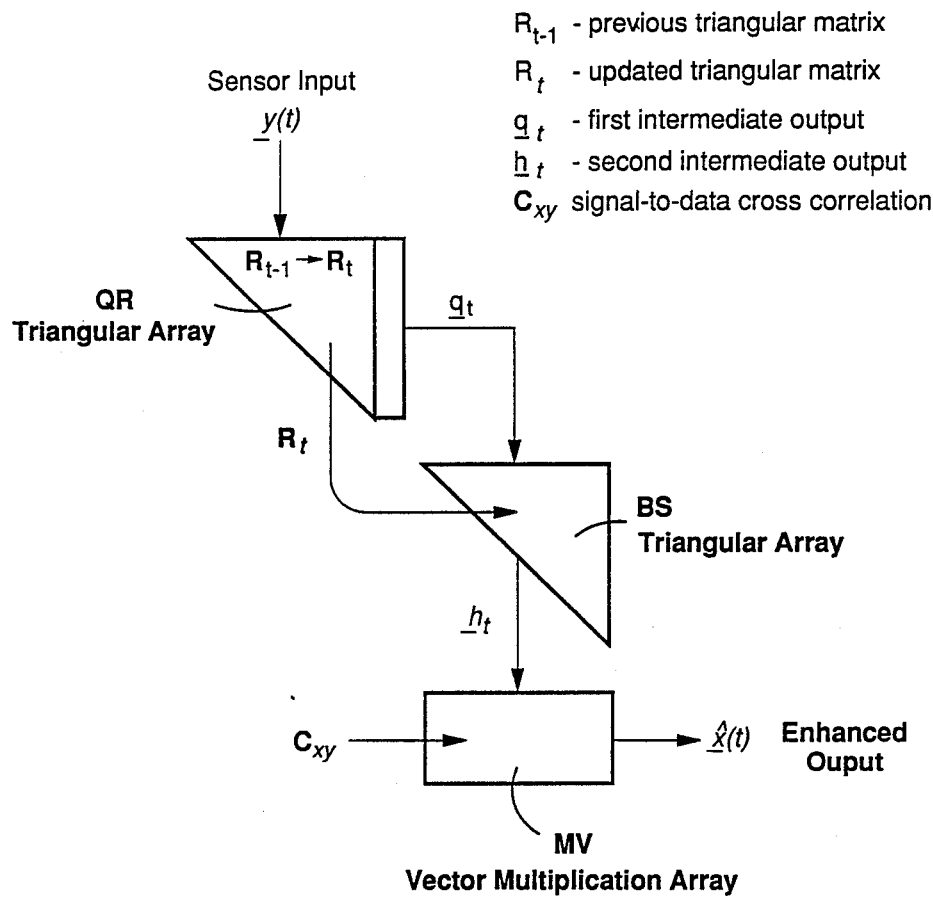
FIGS. 1A and 1B depict the schematic block diagram and detailed interconnections, respectively, of an array architecture to implement the QR-based mixed adaptive filter for the general multiple output channel case using back substitution.

In accordance with the present invention, a mixed adaptive filter is formulated as a least squares problem where no desired signal is available but the signal-to-data cross-correlation is known a priori. This formulation avoids the formation and inversion of the estimated autocorrelation matrix found in the conventional approach. This formulation permits the filter output to be calculated directly from the input data matrix and provides for better numerical conditioning and more structural regularity than the conventional approach.

The least squares formulation of the mixed adaptive filter can be solved by a recursive algorithm consisting first of a QR update. This update is followed by either (1) a back substitution in the general multiple output channel case or (2) a forward elimination in the special single output channel case. Finally a matrix-vector (vector-vector in the special case) multiplication is performed to compute the filter's output. The QR update, back substitution or forward elimination, and matrix-vector multiplication can be implemented by integrated, regularly-structured array architectures that permit the input data to pipeline through the filter in real-time.

LEAST SQUARES FORMULATION OF THE MIXED ADAPTIVE FILTER

In a first aspect of the invention the mixed adaptive filter problem is formulated into a least squares form. Given measurements from m data channels at time t, represented by the m-dimensional vector $\underline{y}(t)$, the objective is to estimate the underlying values of n signals, represented by the n-dimensional vector $\underline{x}(t)$. Furthermore, the estimate represented by the n-dimensional vector $\hat{\underline{x}}(t)$ is to be constructed as a linear combination of the data, $$\hat{\underline{x}}(t) \, \underline{y}(t) \tag{1}$$

where W(t) is an n x m matrix representing the weights of the linear combination. It is assumed that both $\underline{x}(t)$ and $\underline{y}(t)$ are zero mean, quasi-stationary stochastic processes. The linear minimum mean square estimate (LMMSE) of the underlying signal $\underline{x}(t)$ is given by $$\hat{\underline{x}}(t) = C_{xy}(t) C_{yy}^{-1}(t) \underline{y}(t) \tag{2}$$

where $C_{xy}(t)$ is the n x m cross-correlation matrix and $C_{yy}(t)$ the m x m autocorrelation matrix.

In the mixed adaptive filter, the cross-correlation matrix is known a priori. The autocorrelation matrix must be estimated from the input data and combined with the cross-correlation matrix to approximate the LMMSE.

Since $\underline{y}(t)$ is quasi-stationary its autocorrelation matrix may be recursively estimated by $$\hat{C}_{yy}(t) = \lambda^2 \hat{C}_{yy}(t-1) + (1-\lambda^2)\underline{y}(t)\underline{y}'(t) \tag{3}$$

where $\lambda^2$ is an exponential weighting factor between zero and one. The recursion may be initialized by 0 or by an a priori estimate of the autocorrelation matrix.

An inefficient approach to implementing the mixed adaptive filter is to compute the estimated autocorrelation matrix by Equation (3), then invert the matrix and use the results in Equation (2). The inefficiency of this approach stems from the computational expense of inverting the autocorrelation matrix. A conventional approach to overcoming this inefficiency is to eliminate the matrix inversion by applying the matrix inversion lemma to Equation (3) to generate a recursion in $\hat{C}_{yy}^{-1}(t)$ rather than $\hat{C}_{yy}(t)$.

While this conventional approach is efficient, it suffers from two major disadvantages: formation and inversion of the estimated autocorrelation matrix is still implicitly performed, leading to poor numerical conditioning, and the resulting filter structure limits the parallelism and pipelining that can be utilized in filter implementation.

In accordance with the present invention, however, the efficiency is maintained and the disadvantages overcome by formulating the mixed adaptive filter as a least squares problem. This least squares formulation avoids the formation of the inverse estimated autocorrelation matrix and the associated numerical problems by implementing the filter via the data matrix. First define the $m \times t$ data matrix $$Y_t = \lambda^0 \underline{y}(t) \lambda^1(t-1) \ldots \lambda^{t-1} \underline{y}(1) \tag{4}$$

where a prime (') denotes a matrix or vector transpose. The estimated autocorrelation matrix can be represented as $$\hat{C}_{yy}(t) = (1-\lambda^2) Y_t Y_t'. \tag{5}$$

Defining a pinning vector, $\pi' \equiv [1 \, 0 \ldots 0]'$, permits $\underline{y}(t)$ to be expressed as $Y_t' \pi$. The mixed adaptive filter signal estimate can then be expressed as $$\begin{aligned}\hat{\underline{x}}(t) &= C_{xy}(t) \hat{C}_{yy}^{-1}(t) \underline{y}(t) \\ &= (1-\lambda^2)^{-1} C_{xy}(t) (Y_t' Y_t)^{-1} Y_t \pi.\end{aligned} \tag{6}$$

Defining the m-dimensional vector $\underline{h}_t$.

$$\underline{h}_t = (Y_t' Y_t)^{-1} Y_t \pi, \tag{7}$$

permits the mixed adaptive filter formulation of Equation (6) to be expressed as $$\hat{\underline{x}}(t) = (1-\lambda^2)^{-1} C_{xy}(t) \underline{h}_t. \tag{8}$$

Since $\lambda^2$ and $\bar{C}_{xy}$ are known a priori, the only unknown of Equation (8) is $\underline{h}_t$. In Equation (7), $\underline{h}_t$ is defined by a set of normal equations. Hence, $\underline{h}_t$ is equal to the least squares solution of the $t \times m$ overdetermined system $$Y_t \underline{h}_t = \pi \tag{9}$$

QR-BASED RECURSIVE LEAST SQUARES ALGORITHM FOR THE MIXED ADAPTIVE FILTER

Instead of computing $\underline{h}_t$ by Equation (7), which involves the ill-conditioned inverse of the estimated autocorrelation matrix $Y_t' Y_t)^{-1}$, ht may be computed by directly solving the least squares problem of Equation (9).

The least squares problem of Equation (9) can be solved by a conventional QR decomposition approach. The QR decomposition of $Y_t$ is defined by $$Y_t = Q_t' \begin{bmatrix} O \\ R_t \end{bmatrix} \tag{10}$$

where $Q'_t$ is a $t \times t$ orthogonal matrix and $R_t$ is an $m \times m$ upper triangular matrix uniquely determined by the data matrix $Y_t$. Using this decomposition in Equation (9) leads to $$Q_t Y_t h_t = Q_t \pi, \tag{11}$$

or $$\begin{bmatrix} O \\ R_t \end{bmatrix} h_t = \begin{bmatrix} \bullet \\ q_t \end{bmatrix}; \tag{12}$$

where $q_t$ is an m-dimensional vector and $\bullet$ indicates matrix values of no particular concern. The vector $h_t$ may now be computed by $$\underline{h}_t = R_t^{-1} \underline{q}_t. \tag{13}$$

Since $R_t$ is upper triangular, $\underline{h}_t$ in Equation (13) may be efficiently computed by back substitution.

In the adaptive mixed filter, the current triangular factor $R_t$ may be efficiently computed from the previous triangular factor $R_{t-1}$ by a conventional recursive QR decomposition. This is done by defining the current orthogonal factor $Q_t$ in terms of the previous orthogonal factor $Q_{t-1}$, $$Q_t = \bar{Q}_t \begin{bmatrix} 1 & 0 \\ 0 & Q_{t-1} \end{bmatrix}. \tag{14}$$

Using this definition in conjunction with Equations (10) and (4) leads to $$\begin{bmatrix} O \\ R_t \end{bmatrix} = Q_t Y_t \tag{15}$$

$$= \bar{Q}_t \begin{bmatrix} 1 & 0 \\ 0 & Q_{t-1} \end{bmatrix} \begin{bmatrix} \underline{y}'(t) \\ \lambda Y_{t-1} \end{bmatrix} \tag{16}$$

$$= \bar{Q}_t \begin{bmatrix} \underline{y}'(t) \\ O \\ \lambda R_{t-1} \end{bmatrix} \tag{17}$$

Hence, to update $R_{t-1}$ to $R_t$, it is only necessary to rotate the added row $\underline{y}'(t)$ of current data elements into the elements of $\lambda R_{t-1}$. These rotations, denoted by $\bar{Q}_t$ in Equation (17), affect only the first and last m rows of the matrix. Hence the middle rows of zeros are not affected and need not be considered. Note that $Q_t \pi = \bar{Q}_t \pi$, so $q_t$ may be computed by applying the same rotations to $\pi$ and taking the last m elements. This recursive update may be compactly denoted by $$\begin{bmatrix} y'(t) & 1 \\ \lambda R(t-1) & O \end{bmatrix} \underset{Q_t}{\Rightarrow} \begin{bmatrix} O' \bullet \\ R_t q_t \end{bmatrix} \quad (18)$$

The matrix $\bar{Q}_t$ is never explicitly computed, rather its effect is achieved by a series of individual rotation operations that zero each element of $y'(t)$ in succession from left to right. These rotations may be implemented via either Givens or fast Givens rotations. To summarize, first from Equation (18),'$y'(t)$ is rotated into $\lambda R_{t-1}$ via Givens or fast Givens rotations to produce $R_t$. The same rotations are also applied to $\pi$ to produce $q_t$. Next, from Equation (13), $h_t$ is computed via back substitution from $R_t$ and $q_t$. Finally, from Equation (8), $h_t$ is used along with $\lambda^2$ and $C_{xy}(t)$ to compute the output $\underline{x}(t)$.

STEP 1: $\begin{bmatrix} y(t) & 1 \\ \lambda R_{t-1} & O \end{bmatrix} \underset{Q_t}{\Rightarrow} \begin{bmatrix} O' \bullet \\ R_t q_t \end{bmatrix}$ (19)

STEP 2: $h_t = R_t^{-1} q_t$ (20)

STEP 3: $\underline{\hat{x}}(t) = (1 - \lambda^2)^{-1} C_{xy}(t) h_t$ (21)

ARRAY ARCHITECTURAL IMPLEMENTATION OF THE MIXED ADAPTIVE FILTER

The above formulation according to the present invention enables the mixed adaptive filter to be implemented with a balanced triangular array architecture. The invention encompasses two implementation cases. The first case corresponds to the general situation in which there are multiple outputs (n>1). The second case corresponds to the special situation in which there is only a single output channel (n=1).

In the general case shown in FIG. 1A the sensor input data $y'(t)$ is provided to a conventional m×(m+1) triangular array, denoted QR, that contains the previous triangular matrix $R_{t-1}$. This array implements Step 1 of the algorithm by computing an updated triangular matrix $R_t$ and a first intermediate output $q_t$ using either Givens or fast Givens rotations. After 2 m cycles, the updated triangular matrix $R_t$ is contained in the first m columns while the first intermediate output $q_t$ has been computed in the (m+1) column.

Figure 1B:
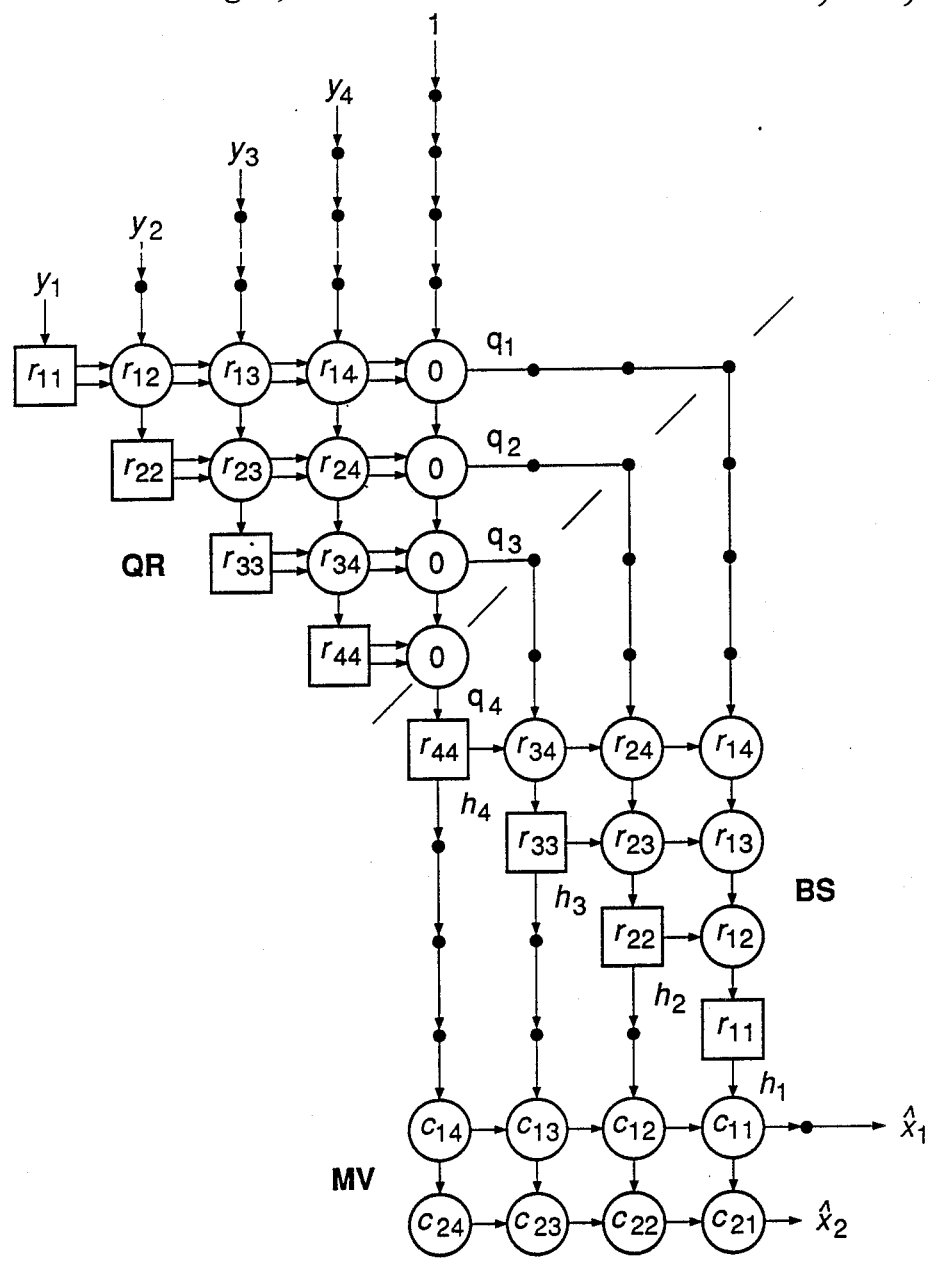

The updated results $R_t$ and $q_t$ are then provided to a second conventional two-dimensional m x m triangular array, denoted BS. This array implements Step 2 of the algorithm by computing a second intermediate output $h_t$ via back substitution in 2 m−1 cycles. The result $h_t$ is then provided to a third, conventional two-dimensional n×m array, denoted MV, that contains the scaled cross-correlation matrix $(1-\lambda^2)^{-1} C_{xy}(t)$. This array implements Step 3 of the algorithm by converting second intermediate output $h_t$ to the enhanced signal data $\underline{x}(t)$ via matrix-vector multiplication in (m+n−1) cycles. These three arrays and their interconnections are illustrated in FIGS. 1A and 1B. The MV and BS arrays can be partially overlapped, so the total computation requires (4m+n−1) cycles. FIG. 1B presents a more detailed interconnection of processors forming the functional blocks of FIG. 1A for the case of four input channels (m=4) and two output channels (n=2).

Figure 2A:
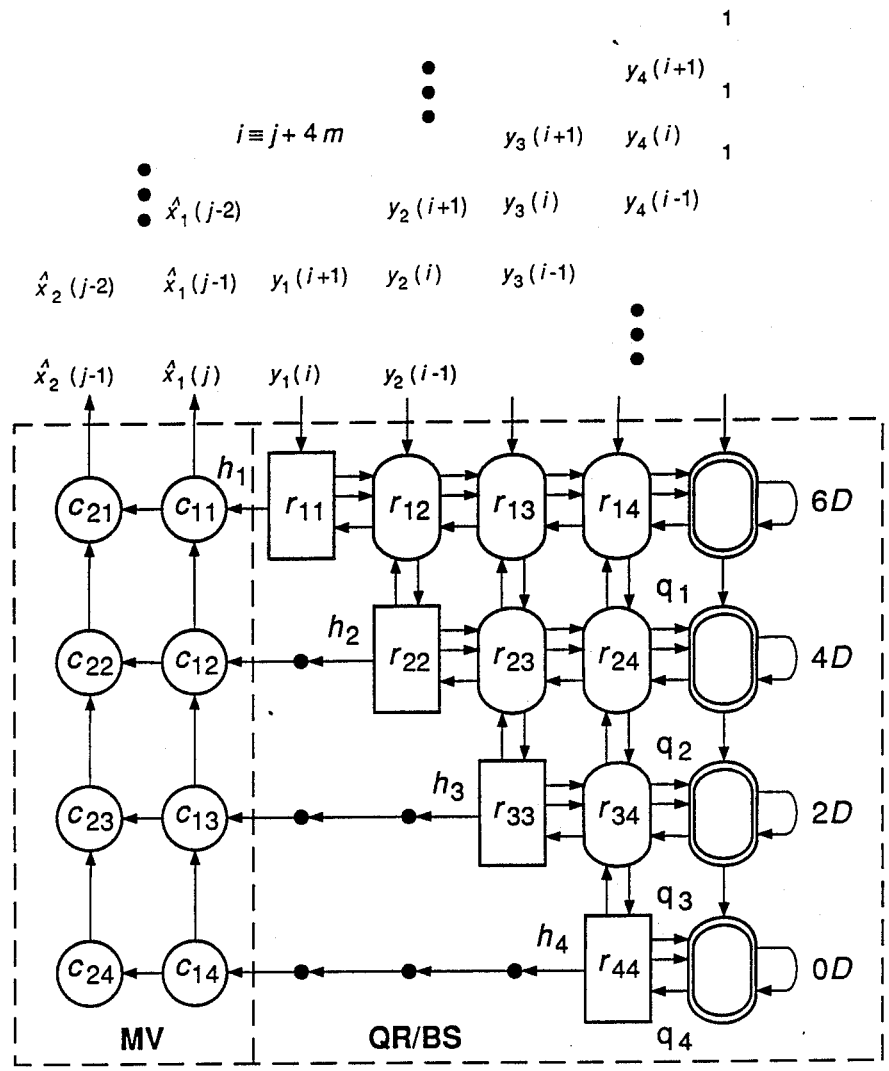
Figure 2E:
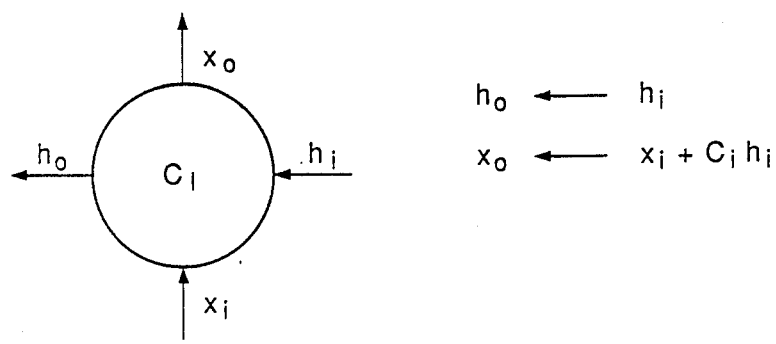

By using a two-dimensional array (BS) for the back substitution, the present formulation provides balanced computations in the QR and BS arrays. Furthermore, the BS array is folded back onto the QR array according to the present invention, as shown in FIG. 2A, to form the compound QR/BS array. The QR update leaves the elements of updated data matrix $R_t$ in the m columns (m=4 in FIG. 2A) of the array nodes and first intermediate output $q_t$ in the final (m+1) column. By folding the FIG. 1A array to form the QR/BS array, global communication of the triangular matrix $R_t$ between separate QR and BS arrays is not required and the elements of first intermediate output $q_t$ can then be transmitted back through the QR/BS array and the back substitution performed to form second intermediate output $h_t$. Thus, the mixed adaptive filter formulated according to the present invention can process the data through a single triangular processor array with bidirectional data flow.

FIG. 2A illustrates the folded array implementation of the general case of the adaptive mixed filter array shown in FIG. 1B. Except as noted for the fifth column, each node includes a single step delay D. Note that successive time samples of the input data are pipelined through the array at a rate of one per cycle. Hence, at time t, different parts of the array are working on different time samples ranging from (t−4m−n+2) to t. processing elements along a lower left to upper right diagonal all work on the same set of time samples simultaneously. Because of this pipelining, the array produces a new output on every cycle. The throughput of the array is one, its computation time is (4 m+n−1), and its pipelining latency is 4 m. No pipeline interleave is required. The number of array processing nodes is m(1/2 m+n+3/2).

FIGS. 2B, 2C, 2D, and 2E illustrate the detailed node computations for an array utilizing Givens rotations to update the QR decomposition. Each QR/BS diagonal node, illustrated FIG. 2B, computes the Givens rotations of the QR decomposition for a particular sample time while simultaneously computing an element of $h$ corresponding to an earlier sample. Each element $r_o$ is delayed by $\alpha$ cycles for processing with a corresponding element of first intermediate output $q_t$.

Figure 2D:
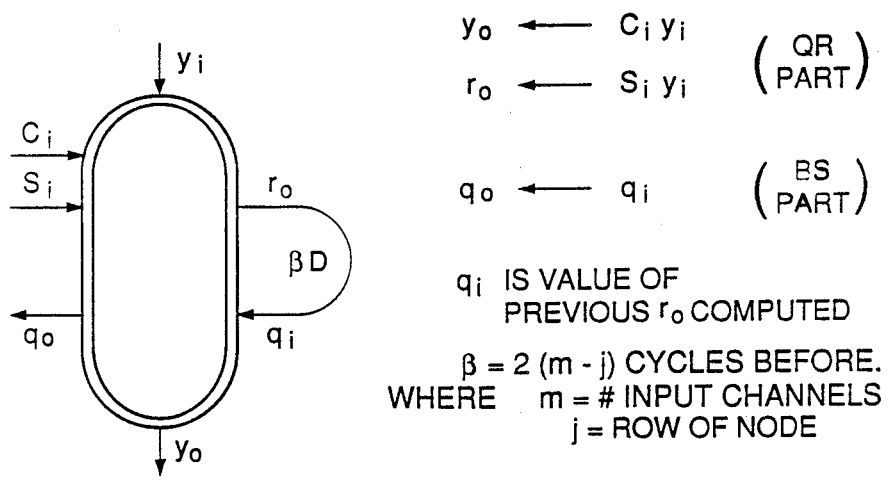

The QR/BS internal nodes, illustrated in FIGS. 2C and 2D, apply the rotations of the QR update for a particular sample time while simultaneously computing the back substitution corresponding to an earlier sample. Position dependent delays $\alpha$ and $\beta$, respectively, are provided to synchronize the processing of the elements $r_o$ of triangular matrices R with the elements of first intermediate output $q_t$. The MV nodes (matrix-vector multiplication), illustrated in FIG. 2E, perform the multiplications and additions necessary to compute the final matrix-vector product for the enhanced signal.

The use of back substitution following the QR update, although necessary in the general case, does require the order in which the elements of $R_t$ are used to be the reverse of the order in which the QR update computes them. This results in (1) bidirectional data flow in the triangular array which makes it difficult to use projection-based mapping methods to trade-off space for time by reducing the dimensionality of the array, and (2) a computation time and pipeline latency proportional to 4 m.

In the single output channel (n=1) case these disadvantages can be overcome by replacing the back substitution computation involving the updated triangular matrix $R_t$ with a forward elimination computation. In the forward elimination computation the elements of $R_t$ are utilized in the same order that they are computed by the QR update. This eliminates the need for bidirectional data flow and reduces the computation time and pipeline latencies to be proportional to 2m rather than 4m. This approach can be efficiently utilized only in the single (n=1) output case because the n x m cross-correlation matrix $C_{xy}$ reduces to an m-dimensional vector $\underline{C}_{xy}$.

Combining Steps 2 and 3 of the QR-based mixed adaptive filter algorithm (Equations (20) and (21)) for the single output channel case yields $$\hat{x}(t)=(1-\lambda^2)^{-1}\underline{C}'_{xy}(t)R_t^{-1}\underline{q}_t \qquad (22)$$

Rather than computing $\underline{h}_t = R_t^{-1}\underline{q}_t$ by back substitution as in the general case, it is just as efficient to compute a second intermediate output $$\underline{q}_t = R'_t{}^{-1}\underline{C}_{xy}(t) \qquad (23)$$

by forward elimination. The enhanced signal (scalar) output is then found by $$\hat{x}(t)=(1-\lambda^2)^{-1}\underline{q}'_t\underline{q}_t \qquad (24)$$

Figure 3:
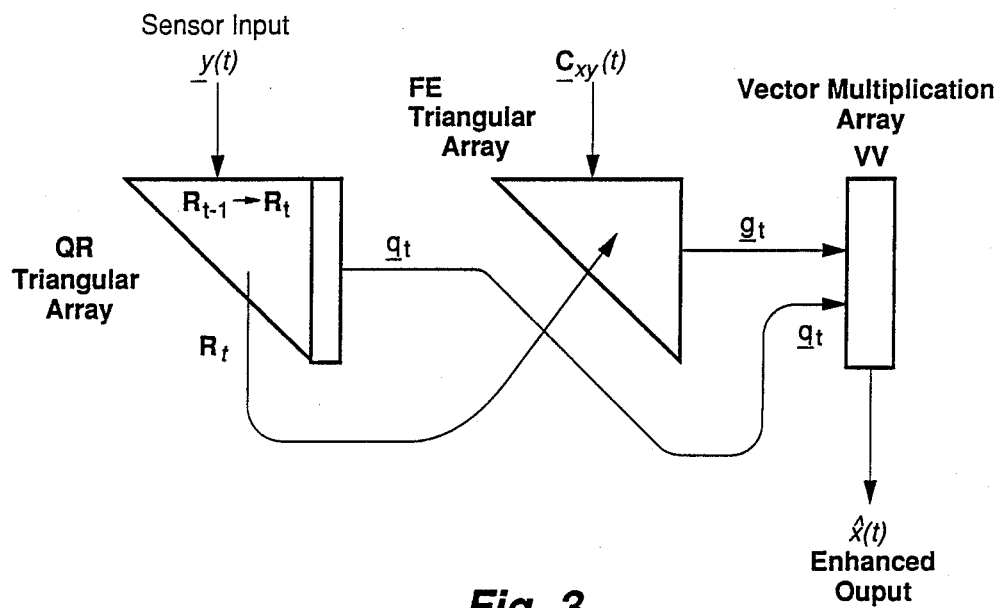
FIG. 3 is a schematic block diagram of an array architecture to implement the QR-based mixed adaptive filter for the special single channel output case using forward elimination.

As illustrated in the block diagram of FIG. 3, the forward elimination can be implemented by a conventional two-dimensional triangular array denoted FE. The updated triangular matrix $R_t$ result of the QR array, along with the a prIori known cross-correlation vector $\underline{C}_{xy}$, are provided to the FE array which computes $\underline{q}_t$. Both $\underline{q}_t$ from the FE array and $\underline{q}_t$ from the QR array are provided to a third m-dimensional linear array VV which performs the vector-vector multiplication inner product to compute the output $\hat{x}(t)$.

Figure 4A:
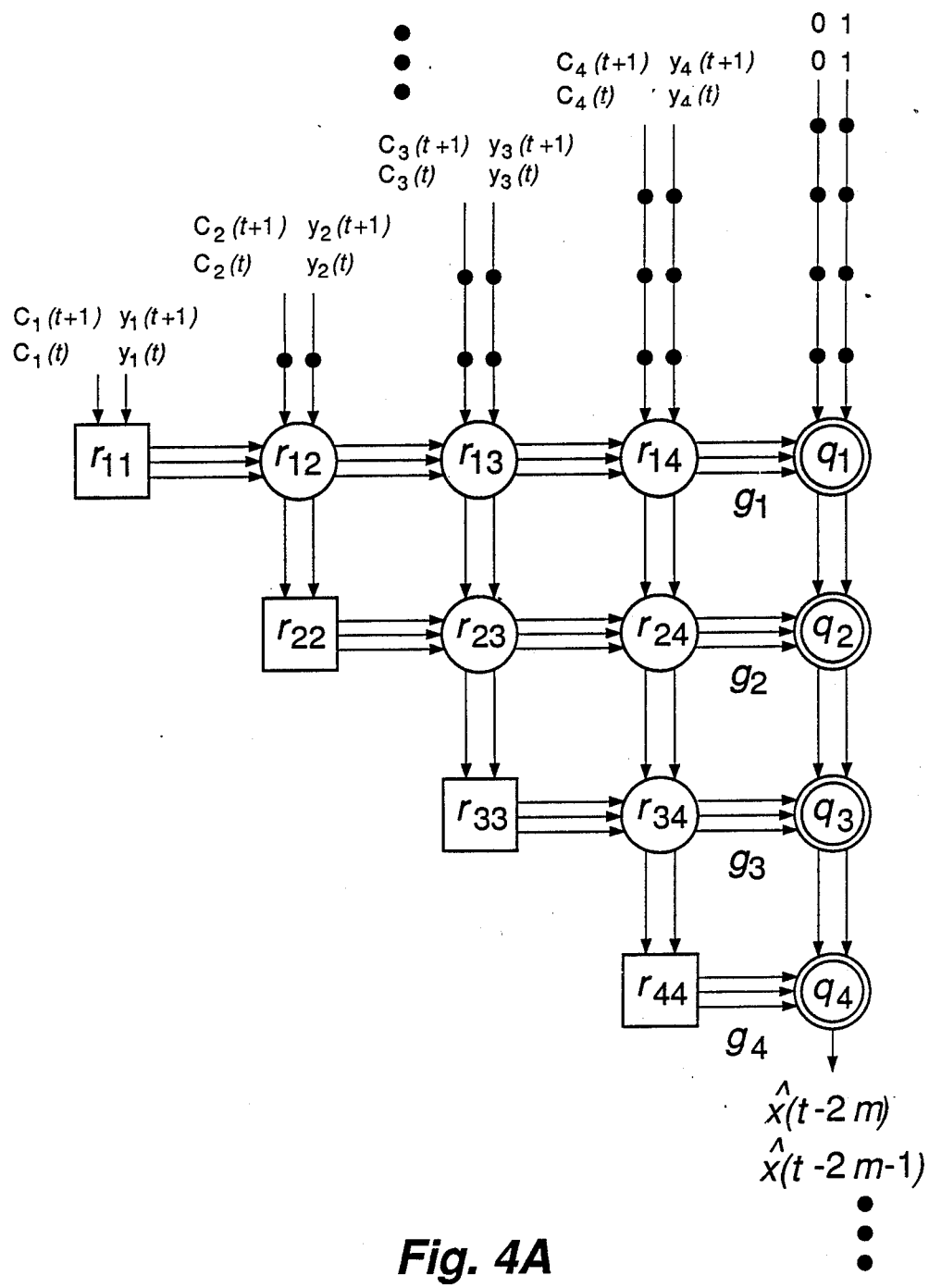

To avoid the global intercommunication of the $R_t$ and $\underline{q}_t$ elements, the present formulation superimposes the FE and VV array on the QR array. The FE array is superimposed on the first m columns of the QR array, while the VV array is superimposed on the (m+1) column of the QR array. The resulting architecture is illustrated in FIG. 4A for the case of m=4 input channels and n=2 output channels. Each internode includes a single cycle delay D.

As in the general case array, successive time samples of the input data are pipelined through the array at a rate of one per cycle. Hence, at time t, different parts of the array are working on different time samples ranging from (t−2m) to t. processing elements along a lower left to upper right diagonal all work on the same set of time samples simultaneously. Because of the pipelining, the array produces a new output on every cycle. The throughput of the array is one, and its computation and pipeline latency are both 2m. No pipeline interleave is required. The number of array processing nodes is m($\frac{1}{2}$m+n+3/2).

FIGS. 4B, 4C, and 4D illustrate detailed node computations for an array utilizing Givens rotations to update the QR decomposition. Each diagonal node, shown in FIG. 4B, computes the Givens rotations of the QR decomposition for a particular sample time and also computes an element of for the same sample. Each internal node, shown in FIG. 4C, applies the rotations of the QR update for a particular sample time and also computes the forward elimination corresponding to the same sample time. Each final column node, shown in FIG. 4D, applies the QR rotations to a portion of the pinning vector, $\pi$, to compute an element of $\underline{q}_t$, and also multiplies that element with the corresponding element of $\underline{q}_t$.

Figure 5:
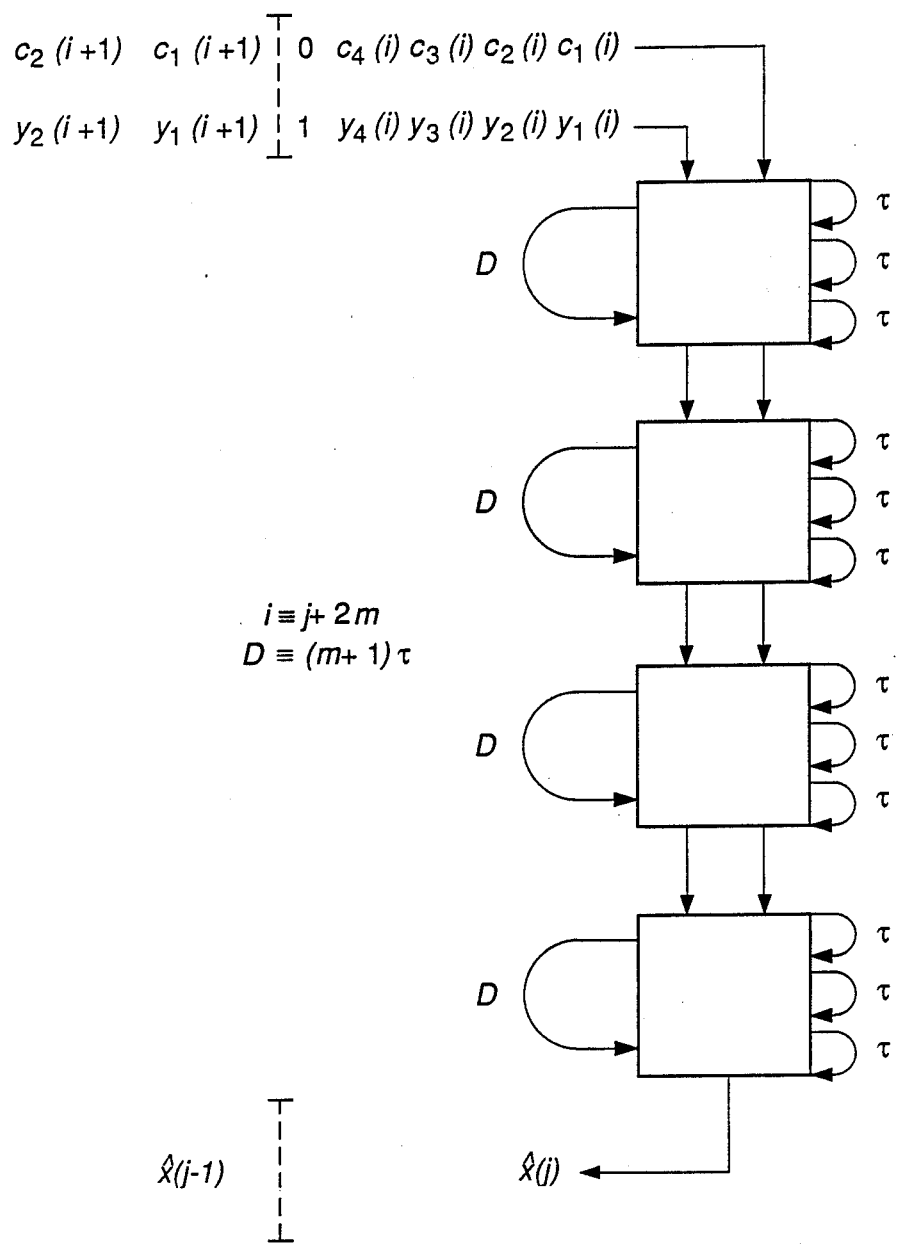
FIG. 5 is a block diagram of a linear array that can be formed from the array of FIG. 4 via standard projection-based mapping methods.

The final two-dimensional array for the single output channel mixed adaptive filter has no bidirectional data flow. Hence, standard, projection-based mapping techniques can also be applied to trade-off time for space (processing nodes) by reducing the array to a linear array as illustrated in FIG. 5. In this array, each node performs all of the functions associated with the nodes of FIGS. 4B, 4C, and 4D. For this linear implementation the computation and latency time remain unchanged at 2 m. However, the throughput is reduced from 1 to 1 m.

APPLICATION TO MEG

In a particular application of the mixed adaptive filter hereinabove discussed, MEG evoked response data has been directly enhanced using data from single-trial measurements. This is in contrast to the conventional approach in which multiple trials are recorded and averaged. In this particular application there are seven input channels, corresponding to the inputs from a seven channel SQUID gradiometer, and seven output channels, corresponding to enhanced versions of each input. The goal is to enhance the brain-related signals with respect to the background interference and sensor noise.

The general signal model is $$\underline{y}(t)=\underline{x}(t)+\underline{n}(t)$$

where $\underline{y}(t)$ is the vector of the measurements, $\underline{x}(t)$ the vector of the underlying signal, and $\underline{n}(t)$ the vector representing the background interference and sensor noise. All vectors are seven-dimensional from the seven input and output channels. The signal and noise vectors are assumed to be independent, and the noise to be zero mean.

Two approaches have been used in applying the mixed adaptive filter to this problem. In the first approach based on noise cancellation the noise is estimated by the mixed adaptive filter and then subtracted from the measurement to yield the signal estimate:

$$\hat{\underline{x}}(t)=\underline{y}(t)-\hat{\underline{n}}(t)$$

In this situation, the noise-to-data cross-correlation is equal to the autocorrelation of the noise. This noise autocorrelation is estimated from the sensor outputs before the stimulus is applied. Once the stimulus is applied, the estimated noise autocorrelation and the input data drive the mixed adaptive filter to produce the desired estimate of the noise.

Figure 6A:
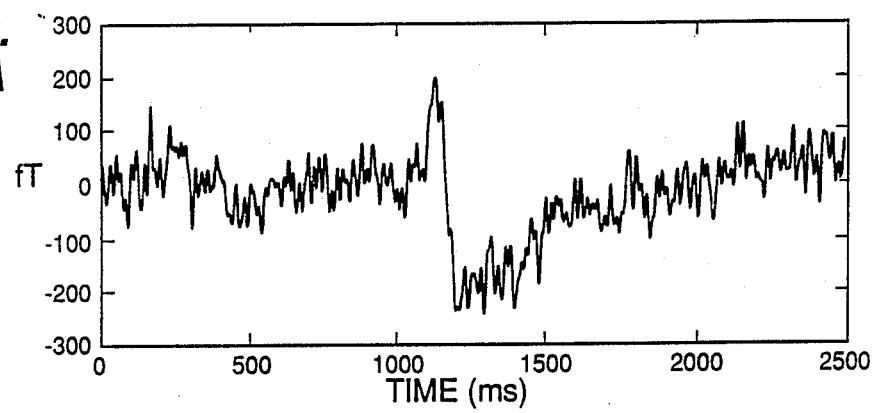
FIGS. 6A, 6B, and 6C are illustrative data signals from an application of the mixed adaptive filter to the enhancement of MEG, auditory evoked responses.
Figure 6B:
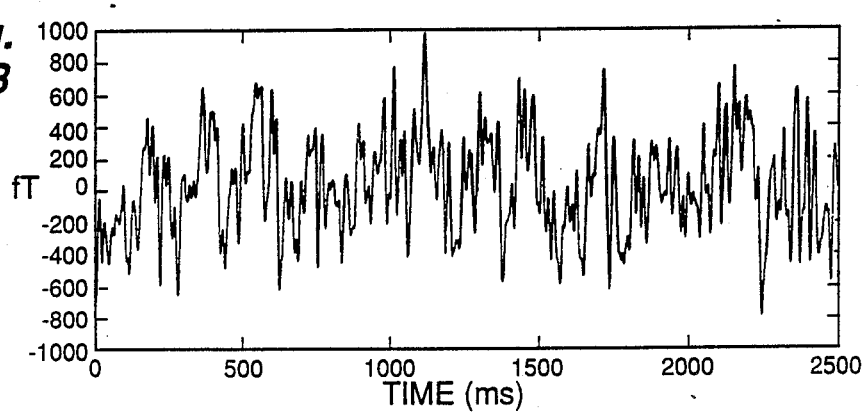
Figure 6C:
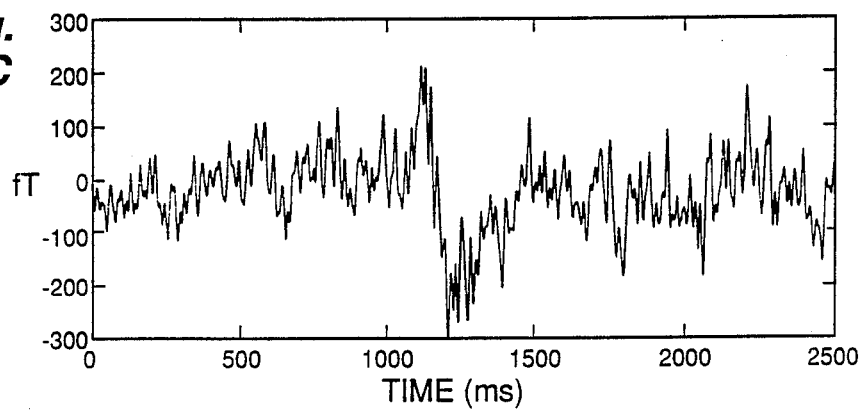

FIG. 6A shows an evoked response to an auditory stimulus at a single head location. This was obtained by averaging the results of fifty (50) trials, with the stimulus applied at 1000 ms. The evoked response is clearly shown. FIG. 6B depicts a single one of these fifty trials. Here the signal-to-noise (SNR) ratio is very poor and the evoked response is not observable. When the single trial of FIG. 6B was enhanced, (along with the other six channels), using array simulations of the mixed adaptive filter herein described, the underlying evoked response is clearly visible in FIG. 6C.

In the second approach, the mixed adaptive filter is used to estimate the underlying evoked response directly rather than the noise. In this situation, the signal-to-data cross-correlation is equal to the signal autocorrelation. This signal autocorrelation is estimated from an earlier signal average or by a priori knowledge of the expected evoked response waveform. This signal autocorrelation, along with the measured data, is provided to the mixed adaptive filter, which then directly computes an estimate of the underlying evoked response.

Figure 7A:
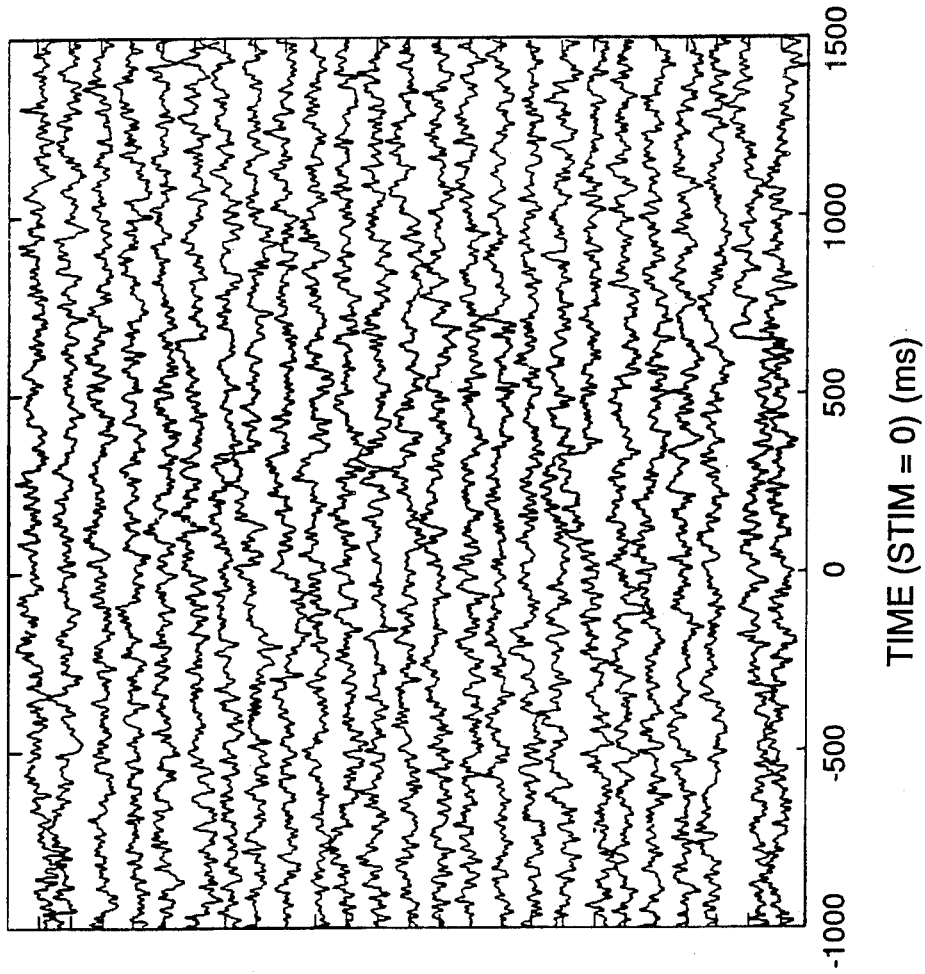
FIGS. 7A and 7B are illustrative data signals illustrating the application of a mixed adaptive filter to the enhancement of MEG auditory evoked responses.
Figure 7B:
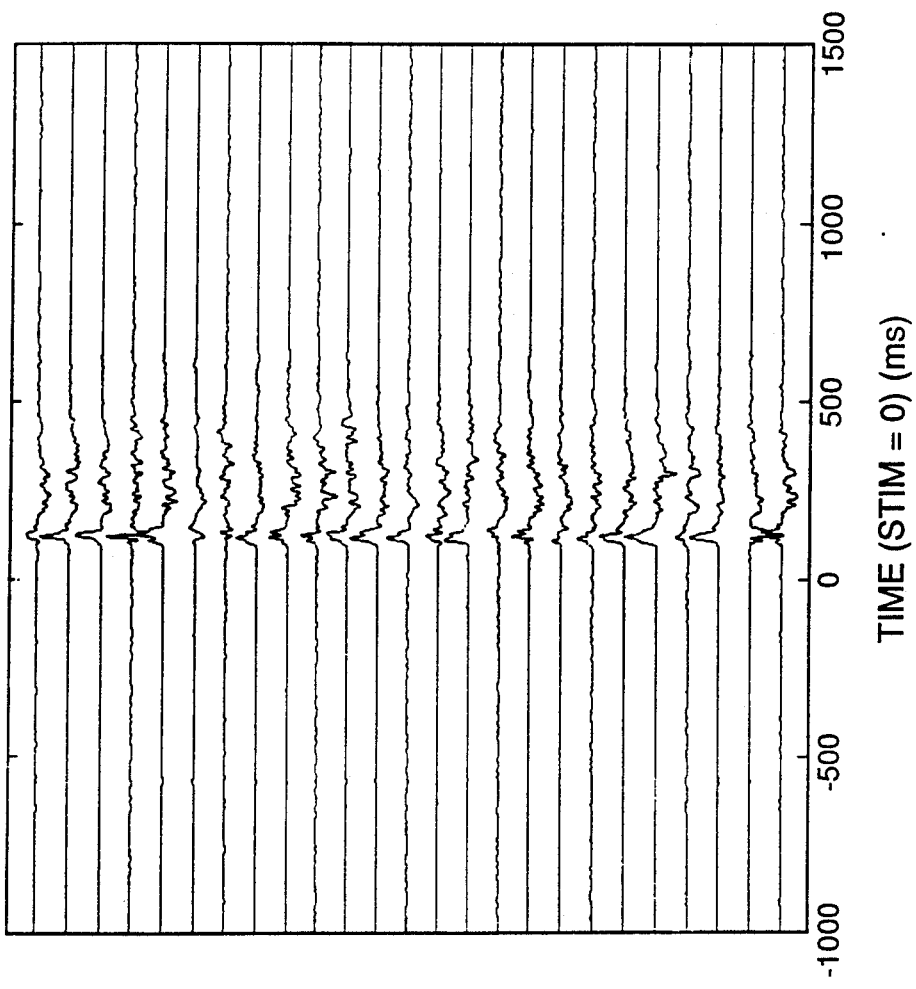

FIG. 7A shows 25 single trials of a single channel measurement of an evoked response to an auditory stimulus applied at 0 ms. Again, due to a poor SNR, the evoked responses are not visible. FIG. 7B shows the same 25 single trials after direct enhancement by the mixed adaptive filter. Evoked responses are now clearly visible in all trials. In this case the signal autocorrelation was first generated from a set of 100 trial averages.

Of the two approaches to using the mixed adaptive filter to enhance MEG data, the second, or direct approach, generally provides the better results. However, this approach requires more a priori knowledge than the first, cancellation approach. When this knowledge is lacking, the cancellation approach may be the only practical alternative.

The foregoing description of the preferred embodiments of the invention have been presented for purposes of illustration and description. It is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A mixed adaptive filter for generating enhanced signal data from successive sensor input data using a known signal-to-data cross correlation, comprising:
   first processor means connected in a first triangular array for rotating second sensor input data into a first stored triangular matrix functionally related to first sensor input data to form a second triangular matrix and having an output column for outputting a first intermediate output;
   second processor means connected in a second triangular array for back substituting said first intermediate output into said second triangular matrix to form a second intermediate output; and
   third processor means for combining said second intermediate output with said known signal-to-data cross correlation to output said enhanced signal data.

2. A filter according to claim 1, wherein said first and second triangular arrays are congruent for simultaneous processing using said second triangular matrix.

3. A mixed adaptive filter for generating enhanced signal data from successive sensor input data using a known signal-to-data cross correlation, comprising:
   first processor means connected in a first triangular array for rotating second sensor input data into a first stored triangular matrix functionally related to first sensor input data to form a second triangular matrix and having an output column for outputting a first intermediate output;
   second processor means connected in a second triangular array for forward elimination of said second triangular matrix with said known signal-to-data cross correlation to form a second intermediate output; and
   third processor means for multiplying said first intermediate output with said second intermediate output to form said enhanced signal data.

4. A filter according to claim 3, wherein said first and second triangular arrays are congruent for simultaneous processing using said second triangular matrix.

5. An MEG signal processing filter for generating an enhanced output signal from an estimated noise autocorrelation and input data obtained in a single trial run having successive signal inputs, including an evoked response from a selected stimulus, comprising:
   first processor means connected in a first triangular array for storing a first triangular signal matrix from first signal data and for generating successive stored updated triangular matrices by rotating second data into said first triangular matrix and rotating successive signal data into corresponding ones of said stored updated triangular matrices and having a column output for providing successive first intermediate outputs;
   second processor means connected in a second triangular array for back substituting each said first intermediate output with a corresponding updated triangular matrix to form successive second intermediate outputs; and
   third processor means for combining said second intermediate outputs with said estimated noises autocorrelation to form said enhanced MEG signal.

6. An MEG signal processing filter according to claim 5, wherein said first and second triangular arrays are congruent for simultaneous processing involving each said updated matrix.

7. A process for generating an enhanced MEG output signal from sensor input data obtained in a single trial run including an evoked response from a selected stimulus, comprising the steps of:
   obtaining first sensor data;
   generating an initial triangular matrix and an autocorrelation matrix from said first sensor data;
   storing said initial triangular matrix in a corresponding triangular array of data processors;
   obtaining second sensor data during said selected stimulus;
   processing said second sensor data through said triangular array in a first direction by updating said initial triangular matrix to form successive triangular matrices by successive rotations and to output successive first intermediate outputs;
   successively processing said first intermediate outputs by back substitution with a corresponding one of said successive triangular matrices in a second direction through said triangular array to form successive second intermediate outputs; and
   converting said successive second intermediate outputs with said autocorrelation matrix to form said enhanced MEG output signal.

8. A process according to claim 7, further including the steps of:
   obtaining said first sensor data in the absence of said selected stimulus to form a noise autocorrelation matrix; and
   converting said successive second intermediate outputs with said noise autocorrelation matrix and subtracting said second sensor data to form said enhanced MEG output signal.

9. A process according to claim 7, further including the steps of:

obtaining said first sensor data in a plurality of trial runs including said stimulus;
generating a time-varying signal autocorrelation matrix by averaging said first sensor data; and
converting said successive second intermediate outputs with said signal autocorrelation matrix to form said enhanced MEG output signal.

* * * * *